United States Patent
Zhang et al.

(10) Patent No.: US 11,548,264 B2
(45) Date of Patent: Jan. 10, 2023

(54) INSULATION SHEET, LAMINATE, AND SUBSTRATE

(71) Applicant: SEKISUI CHEMICAL CO., LTD., Osaka (JP)

(72) Inventors: Rui Zhang, Shanghai (CN); Keigo Oowashi, Kusatsu (JP); Kouji Ashiba, Ibaraki (JP); Aki Kouma, Ibaraki (JP); Shohei Mizuno, Kyoto (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/977,569

(22) PCT Filed: Apr. 17, 2019

(86) PCT No.: PCT/JP2019/016454
§ 371 (c)(1),
(2) Date: Sep. 2, 2020

(87) PCT Pub. No.: WO2019/203266
PCT Pub. Date: Oct. 24, 2019

(65) Prior Publication Data
US 2021/0008839 A1  Jan. 14, 2021

(30) Foreign Application Priority Data
Apr. 17, 2018 (JP) .............. JP2018-079028

(51) Int. Cl.
*B32B 15/092* (2006.01)
*B32B 27/08* (2006.01)
(Continued)

(52) U.S. Cl.
CPC ............ *B32B 15/092* (2013.01); *B32B 27/08* (2013.01); *B32B 27/20* (2013.01); *B32B 27/38* (2013.01);
(Continued)

(58) Field of Classification Search
CPC ........ C08L 63/00–10; C08K 2003/385; C08K 13/04; B32B 15/092; B32B 27/08; H05K 1/036; H05K 1/0373; H05K 2201/0195
See application file for complete search history.

(56) References Cited

U.S. PATENT DOCUMENTS

| 5,834,101 A | 11/1998 | Hayashi |
| 2012/0067631 A1 | 3/2012 | Kusukawa et al. |

(Continued)

FOREIGN PATENT DOCUMENTS

| CN | 106912159 | 6/2017 |
| CN | 107466269 | 12/2017 |

(Continued)

OTHER PUBLICATIONS

Azo Materials, Boron Nitride (BN)—Properties and Information on Boron Nitride, https://www.azom.com/article.aspx?ArticleID=78 (2001).*

(Continued)

*Primary Examiner* — Kregg T Brooks
(74) *Attorney, Agent, or Firm* — Wenderoth, Lind & Ponack, L.L.P.

(57) ABSTRACT

An electrical insulation sheet comprising a resin composition layer, wherein one surface side has a higher relative permittivity at a frequency of 1 MHz than the relative permittivity of an other surface side, and a circuit pattern is formed on the one surface side, a laminated body comprising the electrical insulation sheet and a metal plate on a metal base plate in that order, wherein a circuit pattern is formed on the metal plate, and a substrate comprising the electrical insulation sheet and a metal plate on a metal base plate in that order, wherein the metal plate has a circuit pattern.

17 Claims, 1 Drawing Sheet

(51) Int. Cl.
    *B32B 27/20* (2006.01)
    *B32B 27/38* (2006.01)
    *C08K 3/38* (2006.01)
    *H05K 1/03* (2006.01)
    *C08K 13/04* (2006.01)

(52) U.S. Cl.
    CPC ............... *C08K 3/38* (2013.01); *C08K 13/04* (2013.01); *H05K 1/036* (2013.01); *H05K 1/0373* (2013.01); *B32B 2250/03* (2013.01); *B32B 2250/04* (2013.01); *B32B 2250/05* (2013.01); *B32B 2264/10* (2013.01); *B32B 2264/201* (2020.08); *B32B 2264/308* (2020.08); *B32B 2307/206* (2013.01); *B32B 2307/732* (2013.01); *B32B 2363/00* (2013.01); *B32B 2457/08* (2013.01); *C08K 2003/385* (2013.01); *H05K 2201/0195* (2013.01)

(56) References Cited

U.S. PATENT DOCUMENTS

| | | | |
|---|---|---|---|
| 2012/0325473 A1* | 12/2012 | Bicerano | C09K 8/68 977/773 |
| 2013/0143981 A1 | 6/2013 | Miyata et al. | |
| 2014/0030848 A1* | 1/2014 | Ikemoto | C09D 163/00 438/107 |
| 2014/0116764 A1 | 5/2014 | Inoue et al. | |
| 2015/0210884 A1 | 7/2015 | Hayashi et al. | |
| 2018/0068758 A1 | 3/2018 | Jendenmalm et al. | |
| 2020/0388551 A1* | 12/2020 | Ashiba | H01L 21/4882 |

FOREIGN PATENT DOCUMENTS

| | | | |
|---|---|---|---|
| JP | 4-24996 | | 1/1992 |
| JP | 06152088 | A * | 5/1994 |
| JP | 7-232403 | | 9/1995 |
| JP | 2008-201124 | | 9/2008 |
| JP | 2008-270678 | | 11/2008 |
| JP | 2012-15557 | | 1/2012 |
| JP | 2012-067221 | | 4/2012 |
| JP | 2017-069534 | | 4/2017 |
| KR | 10-2014-0088047 | | 7/2014 |
| KR | 10-2015-0002834 | | 1/2015 |
| WO | 2012/172776 | | 12/2012 |

OTHER PUBLICATIONS

Azo Materials, Alumina—Aluminium Oxide—Al2O3—A Refractory Ceramic Oxide, https://www.azom.com/article.aspx?ArticleID=52 (2001).*
Partial machine translation of JP-06152088-A (1994).*
International Search Report (ISR) dated Jul. 9, 2019 in corresponding International (PCT) Application No. PCT/JP2019/016454.
Extended European Search Report dated Mar. 10, 2021, in corresponding European Patent Application No. 19788343.2.

* cited by examiner

INSULATION SHEET, LAMINATE, AND SUBSTRATE

TECHNICAL FIELD

The present invention relates to an electrical insulation sheet, a laminated body, and a substrate.

BACKGROUND ART

In electronic devices, communication devices, and the like, a printed wiring board having an electrical insulation layer is used. This electrical insulation layer is often formed using a resin sheet (electrical insulation sheet) filled with an inorganic material. Further, with the miniaturization and increased performance of electronic devices, communication devices, and the like that has happened in recent years, the mounting density of electronic components has increased, and there is a greater need to dissipate the heat generated from the electronic components. That is, there is a strong requirement for electrical insulation sheets to have high thermal conductivity as well as electrical insulation properties.

Conventionally, in order to improve the electrical insulation properties and thermal conduction properties of resin sheets, various studies have been conducted regarding the inorganic materials to be used, the used amounts, the shape and particle size of the inorganic materials, and the like.

For example, Patent Literature 1 discloses an electrical insulation sheet that contains two inorganic fillers having different particle diameters in order to obtain an electrical insulation sheet having excellent electrical insulation properties while maintaining thermal conduction properties.

CITATION LIST

Patent Literature

PTL 1: JP 2012-15557 A

SUMMARY OF INVENTION

Technical Problem

However, it is still difficult to achieve a high level of thermal conduction properties as well as a high level of electrical insulation properties. This is because these two properties are essentially in a trade-off relationship. Further, in order to have a high level of thermal conductance and electrical insulation properties, there is a limit to the combinations of the inorganic materials to be used, their amounts, shapes, particle sizes, and the like, and the design range has been greatly limited.

In addition, when used for a circuit substrate, good adhesive properties between the electrical insulation sheet and the metal plate on which the circuit pattern is formed are required.

In view of the above, it is an object of the present invention to provide an electrical insulation sheet that has good thermal conductance as well as high electrical insulation properties, and can exhibit good adhesive properties with a metal plate when laminated thereon.

Solution to Problem

As a result of diligent studies to solve the above-described problems, the present inventors conceived of the present invention, and discovered that those problems could be solved. That is, the present invention is as follows.

[1]
An electrical insulation sheet comprising a resin composition layer, wherein one surface side has a higher relative permittivity at a frequency of 1 MHz than a relative permittivity of an other surface side, and a circuit pattern is formed on the one surface side.

[2]
The electrical insulation sheet according to [1], wherein a relative permittivity at 10% in a thickness direction from the one surface is 3.5 to 9, and a relative permittivity at 10% in a thickness direction from the other surface is 3 to 8.5.

[3]
The electrical insulation sheet according to [1] or [2], wherein
the resin composition layer has at least two layers, and
a first resin composition layer comprising the one surface has a relative permittivity at a frequency of 1 MHz that is higher than a relative permittivity of a second resin composition layer comprising the other surface.

[4]
The electrical insulation sheet according to [3], further comprising a third resin composition layer on the other surface side of the second resin composition layer.

[5]
The electrical insulation sheet according to [3] or [4], wherein the first resin composition layer has a thickness that is smaller than a thickness of the second resin composition layer.

[6]
The electrical insulation sheet according to [4] or [5], wherein the third resin composition layer has a thickness that is smaller than the thickness of the second resin composition layer.

[7]
The electrical insulation sheet according to any of [4] to [6], wherein at least one of the first resin composition layer, the second resin composition layer, and the third resin composition layer comprises an epoxy resin and an inorganic filler.

[8]
The electrical insulation sheet according to [7], wherein the inorganic filler comprises plate-like inorganic particles having a thermal conductivity of 10 W/(m·K) or more.

[9]
The electrical insulation sheet according to [7] or [8], wherein the inorganic filler comprises plate-like inorganic particles, inorganic particles A, and inorganic particles B, and
any one or more of the plate-like inorganic particles, the inorganic particles A, and the inorganic particles B have a thermal conductivity of 10 W/(m·K) or more.

[10]
The electrical insulation sheet according to [9], wherein the inorganic particles A have an aspect ratio of 2 or less.

[11]
The electrical insulation sheet according to any one of [8] to [10], wherein the plate-like inorganic particles in the inorganic filler have a content of 1 to 100% by volume.

[12]
The electrical insulation sheet according to any one of [8] to [11], wherein the plate-like inorganic particles are boron nitride.

[13]
The electrical insulation sheet according to any one of [8] to [12], wherein the plate-like inorganic particles are aggregated particles.

[14]

The electrical insulation sheet according to any one of [9] to [13], wherein the inorganic particles B have a compressive strength when compressed by 20% that is higher than a compressive strength of the plate-like inorganic particles.

[15]

The electrical insulation sheet according to any one of [9] to [14], wherein the inorganic particles B are boron nitride.

[16]

The electrical insulation sheet according to any one of [9] to [15], wherein the first resin composition layer comprises the inorganic particles A and the inorganic particles B, and the second resin composition layer comprises the plate-like inorganic particles.

[17]

The electrical insulation sheet according to any one of [9] to [15], wherein the first resin composition layer comprises the inorganic particles A and the inorganic particles B, the second resin composition layer comprises the plate-like inorganic particles, and the third resin composition layer comprises the plate-like inorganic particles, the inorganic particles A and the inorganic particles B.

[18]

The electrical insulation sheet according to any one of [9] to [15], wherein the first resin composition layer comprises the inorganic particles A and the inorganic particles B, the second resin composition layer comprises the plate-like inorganic particles, the inorganic particles A and the inorganic particles B, and the third resin composition layer comprises the plate-like inorganic particles.

[19]

The electrical insulation sheet according to any one of [1] to [18], wherein a difference between the relative permittivity on the one surface side and the relative permittivity on the other surface side is 0.5 or more.

[20]

A laminated body comprising the electrical insulation sheet according to any one of [1] to [19] and a metal plate in that order on a metal base plate, wherein a circuit pattern is formed on the metal plate.

[21]

A substrate comprising the electrical insulation sheet according to any one of [1] to [19] and a metal plate in that order on a metal base plate, wherein the metal plate has a circuit pattern.

Advantageous Effects of Invention

According to the present invention, an electrical insulation sheet can be provided having good thermal conductance and as well as high electrical insulation properties, and that is capable of exhibiting good adhesive properties with a metal plate when laminated therewith.

DESCRIPTION OF EMBODIMENTS

Electrical Insulation Sheet

Figure 1:
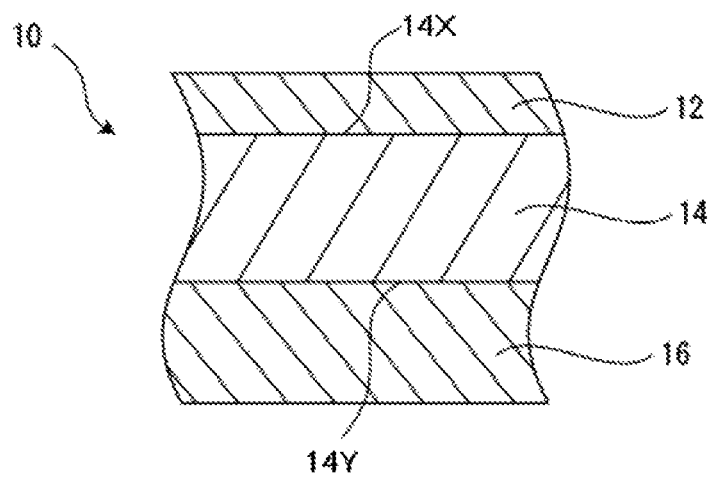
FIG. 1 is a cross-sectional view schematically illustrating a laminated body according to an embodiment of the present invention.

The electrical insulation sheet of the present invention comprises a resin composition layer, wherein one surface side has a higher relative permittivity at a frequency of 1 MHz than the relative permittivity of an other surface side, and a circuit pattern is formed on the one surface side. As a result, the electrical insulation sheet can be a constituent member that secures electrical insulation properties between a metal plate on which the circuit pattern is formed and a metal base material.

The resin composition layer may be composed of one layer or may be composed of two or more layers. Further, the electrical insulation sheet is preferably composed of a resin composition layer.

Here, when the resin composition layer is composed of one layer, the surface that the metal plate on which the circuit pattern is formed is to be provided on the resin composition layer is referred to as "one surface" of "one surface side". In this case, "one surface of the electrical insulation sheet" is synonymous with "one surface of the resin composition layer". Further, the surface that the metal plate on which the circuit pattern is formed is not provided on is "another surface" in "another surface side". In this case, "another surface of the electrical insulation sheet" is synonymous with "another surface of the resin composition layer".

Further, when the resin composition layer is composed of n layers (n is an integer of 2 or more), the surface that the metal plate on which a circuit pattern is formed is to be provided on at the first resin composition layer (first resin composition layer) is the "one surface" of the "one surface side". In this case, "one surface of the electrical insulation sheet" is synonymous with "one surface of the resin composition layer" (the surface that the metal plate on which the circuit pattern is formed is to be provided at the first resin composition layer). In addition, the surface on the external side in the thickness direction of the n-th resin composition layer is the "another surface" of the "another surface side". In this case, "another surface of the electrical insulation sheet" is synonymous with "another surface of the n-layer resin composition layer" (the surface on the external side in the thickness direction of the n-th resin composition layer).

In either case, a metal base plate is provided on the other surface side.

When the resin composition layer is composed of three or more layers, if the relative permittivity of the first resin composition layer is larger than the relative permittivity of an n-th resin composition layer from the second layer, the magnitude of the relative permittivity of the n-th resin composition layer from the second layer is not particularly limited.

For example, in the case of a three-layer structure, if the relative permittivity of each of the first resin composition layer, the second resin composition layer, and the third resin composition layer are $\varepsilon_1$, $\varepsilon_2$, and $\varepsilon_3$, respectively, it is possible that $\varepsilon_1 > \varepsilon_2 > \varepsilon_3$, $\varepsilon_1 > \varepsilon_2 < \varepsilon_3$ (where $\varepsilon_1 > \varepsilon_3$), and $\varepsilon_1 > \varepsilon_2 = \varepsilon_3$. However, from the viewpoint of obtaining better electrical insulation properties, it is preferable that $\varepsilon_1 > \varepsilon_2 > \varepsilon_3$.

It is noted that the term "relative permittivity" as used herein refers to relative permittivity at a frequency of 1 MHz.

When a high voltage is applied to a circuit substrate using the electrical insulation sheet of the present invention, the electric field concentrates in the circuit pattern and at the edges of the electrical insulation sheet, causing breakdown to occur. The present inventors have found that when the dielectric constant of the electrical insulation sheet is high, the electric field tends to become concentrated and the edges tend to break down. Accordingly, the present inventors found that even when the dielectric constant of one surface of the electrical insulation sheet on the circuit pattern side is high, by reducing the dielectric constant of the other surface of the electrical insulation sheet on the side on which the circuit pattern is not formed, concentration of the electric field can be alleviated, thereby enabling the electrical insulation properties of the electrical insulation sheet to be greatly improved.

The method for making the relative permittivity on one surface side to be higher than the relative permittivity on the other surface side is not particularly limited. Examples thereof may include a method in which a sheet having a high relative permittivity and a sheet having a low relative permittivity are laminated, a method in which a coating film of a resin composition including an inorganic filler having a low relative permittivity is formed, then a coating film of a resin composition including an inorganic filler having a high relative permittivity is formed, and curing is carried out, a method in which two kinds of resins having different dielectric constants are mixed and extruded by a syringe while changing the extrusion speed to confer a gradient, and the like.

Further, even for an inorganic filler having the same relative permittivity, since the overall relative permittivity can be changed based on the content of the inorganic filler, there can also be employed a method in which a coating film of a resin composition having a small inorganic filler content is formed, then a coating film of a resin composition having a large inorganic filler content is formed, and curing carried out. In this case, the resin composition layer has a single-layer structure.

From the viewpoint of further alleviating electric field concentration, the relative permittivity at 10% in the thickness direction from one surface is preferably 3.5 to 9, and more preferably 4 to 9. Further, the relative permittivity at 10% in the thickness direction from the other surface is preferably 3 to 8.5, and more preferably 3 to 8. For example, the relative permittivity at 10% in the thickness direction can be estimated by observing the cross section to determine what kind of filler is used.

From the viewpoint of alleviating electric field concentration, the difference between the relative permittivity on one surface side and the relative permittivity on the other surface side is preferably 0.5 or more, more preferably 2 or more, and further preferably 4 or more.

It is noted that the relative permittivity can be measured by the method described in the Examples described below.

In addition, by including a resin composition layer and setting the relative permittivity of one surface side at a frequency of 1 MHz to be higher than the relative permittivity of the other surface side, when laminated with a metal plate, the electrical insulation sheet of the present invention can obtain good adhesive properties, that is, a large peel strength, between the metal plate and the electrical insulation sheet.

As described later, by appropriately setting the physical properties, the kind, and the like of the inorganic filler in the resin composition layer, it is easier to obtain good adhesive properties more reliably. For example, it is possible to use a filler having a high compressive strength or a filler having on its surface a large number of functional groups that have a high affinity with the resin.

The adhesive properties (peel strength) between the metal plate and the electrical insulation sheet can be measured by the method described in Examples described later, and are preferably 6 N/cm or more.

The present invention will now be described in more detail with reference to a mode in which the electrical insulation sheet includes a resin composition layer. However, the present invention is not limited to this mode.

(Resin Composition Layer)

The resin composition layer includes a resin and an inorganic filler.

The resin included in the resin composition layer is not particularly limited, and may be a thermoplastic resin, a thermosetting resin, and the like. Examples of the thermoplastic resin include a styrene resin, a phenoxy resin, a phthalate resin, a thermoplastic urethane resin, a polyamide resin, a thermoplastic polyimide resin, a ketone resin, a norbornene resin, and the like. Examples of the thermosetting resin include an amino resin, a phenol resin, a thermosetting urethane resin, an epoxy resin, a thermosetting polyimide resin, an amino alkyd resin, and the like. Examples of the amino resin include urea resin and melamine resin. When there are two or more resin composition layers, the resins included in these layers may be the same or different.

Among the resins described above, an epoxy resin is preferable considering heat resistance. The epoxy resin is obtained by reacting an epoxy compound with a thermal curing agent.

Examples of the epoxy compound include a bisphenol A type epoxy compound, a bisphenol F type epoxy compound, a bisphenol S type epoxy compound, a phenol novolac type epoxy compound, a biphenyl type epoxy compound, a biphenyl novolac type epoxy compound, a biphenol type epoxy compound, a naphthalene type epoxy compound, a fluorene type epoxy compound, a phenol aralkyl type epoxy compound, a naphthol aralkyl type epoxy compound, a dicyclopentadiene type epoxy compound, an anthracene type epoxy compound, an epoxy compound having an adamantane skeleton, an epoxy compound having a tricyclodecane skeleton, a naphthylene ether type epoxy compound, an epoxy compound having a triazine core in the skeleton, and the like.

The epoxy compound is preferably a bisphenol A type epoxy compound.

The thermal curing agent is not particularly limited as long as it has a functional group capable of reacting with the epoxy group of the epoxy compound. Examples may include a cyanate ester compound (cyanate ester curing agent), a phenol compound (phenol thermal curing agent), an amine compound (amine thermal curing agent), a thiol compound (thiol thermal curing agent), an imidazole compound, a phosphine compound, an acid anhydride, an active ester compound, dicyandiamide, and the like.

Examples of the cyanate ester compound include a novolac type cyanate ester resin, a bisphenol type cyanate ester resin, a prepolymer obtained by partially trimerizing these, and the like. Examples of the novolac type cyanate ester resin include a phenol novolac type cyanate ester resin, an alkylphenol type cyanate ester resin, and the like.

Examples of the bisphenol type cyanate ester resin include a bisphenol A type cyanate ester resin, a bisphenol E type cyanate ester resin, a tetramethylbisphenol F type cyanate ester resin, and the like.

Commercially available cyanate ester compounds include phenol novolac type cyanate ester resins ("PT-30" and "PT-60" manufactured by Lonza Japan Ltd.), prepolymers obtained by trimerizing a bisphenol type cyanate ester resin ("BA-230S", "BA-3000S", "BTP-1000S", and "BTP-6020S" manufactured by Lonza Japan Ltd.), and the like.

Examples of the phenol compound include a novolac type phenol, a biphenol type phenol, a naphthalene type phenol, a dicyclopentadiene type phenol, an aralkyl type phenols, a dicyclopentadiene type phenol, and the like.

Commercially available phenol compounds include a novolac type phenol ("TD-2091" manufactured by DIC Corporation), a biphenyl novolac type phenols ("MEHC-7851" manufactured by Meiwa Plastic Industries, Ltd.), an aralkyl type phenol compound ("MEH-7800" manufactured by Meiwa Plastic Industries, Ltd.), a phenol having an aminotriazine skeleton ("LA1356" "LA3018-50P" manufactured by DIC Corporation), and the like.

The mixing amount of the thermal curing agent to be reacted with the epoxy compound is appropriately selected, but is, with respect to 100 parts by mass of the epoxy compound, preferably 1 part by mass or more, and is preferably 50 parts by mass or less, and more preferably 30 parts by mass or less.

From the viewpoint of more effectively increasing adhesive properties and electrical insulation properties, the content of the epoxy resin obtained by reacting the epoxy compound and the thermal curing agent in the resin composition layer is preferably 5% by volume or more, and more preferably 10% by volume or more, and is preferably 80% by volume or less, and more preferably 70% by volume or less.

The inorganic filler contained in the resin composition layer preferably has thermal conductance.

Here, the inorganic filler preferably contains plate-like inorganic particles, and more preferably contains plate-like inorganic particles, inorganic particles A, and inorganic particles B. By including at least plate-like inorganic particles, plate-like inorganic particles having a major axis direction that is parallel to the thickness direction and plate-like inorganic particles having a major axis direction that is perpendicular to the thickness direction can be mixed in a well-balanced manner, thereby enabling electrical insulation properties to be increased while having thermal conductance.

It is preferable that at least one of the kinds of inorganic filler has a thermal conductivity of 10 W/(m·K) or more. For example, when only the plate-like inorganic particles are included, the plate-like inorganic particles have a thermal conductivity of 10 W/(m·K) or more, and when three kinds are included, that is the plate-like inorganic particles, the inorganic particles A, and the inorganic particles B are included, one or more of them have a thermal conductivity of 10 W/(m·K) or more.

As described above, it is preferable that any one or more of the plate-like inorganic particles, the inorganic particles A, and the inorganic particles B have a thermal conductivity of 10 W/(m·K) or more, and it is preferable that all three of those have a thermal conductivity of 10 W/(m·K) or more. This enables the thermal conductance of the resin composition layer to be increased. The thermal conductivity is more preferably 15 W/(m·K) or more, and further preferably 20 W/(m·K) or more. The upper limit of the thermal conductivity is not particularly limited. Inorganic fillers having a thermal conductivity of about 300 W/(m·K) are widely known. Further, an inorganic filler having a thermal conductivity of about 200 W/(m·K) is easily available.

It is noted that the plate-like inorganic particles, the inorganic particles A, and the inorganic particles B differ in one or more of composition, shape, and compressive strength. For example, when the plate-like inorganic particles and the inorganic particles B are boron nitride, as the shape, it is sufficient when compressed by 20% that the compressive strength is different, or that the average major axis of the primary particles is different.

The plate-like inorganic particles are preferably a boron nitride. Examples thereof include hexagonal boron nitride, cubic boron nitride, a boron nitride produced by a reduction nitriding method of a boron compound and ammonia, a boron nitride produced from a boron compound and a nitrogen-containing compound such as melamine, a boron nitride produced from sodium borohydride and ammonium chloride, and the like. From the viewpoint of much more effectively increasing the thermal conductance, the boron nitride is preferably hexagonal boron nitride.

From the viewpoint of much more effectively increasing the electrical insulation properties and the thermal conductance, the plate-like inorganic particles are preferably aggregated particles, and more preferably plate-like boron nitride aggregated particles. The boron nitride aggregated particles are secondary particles obtained by aggregating primary particles of boron nitride.

The method for producing the boron nitride aggregated particles is not particularly limited. Examples thereof may include a spray drying method and a fluidized bed granulation method. The method for producing the boron nitride aggregated particles is preferably a spray drying method. The spray drying method can be classified into a two-fluid nozzle method, a disk method (also called a rotary method), an ultrasonic nozzle method, and the like based on the spray method, and any of these methods can be applied. The ultrasonic nozzle method is preferable from the viewpoint that total pore volume can be controlled more easily.

The boron nitride aggregated particles are preferably produced by using boron nitride primary particles as a material. The boron nitride used as the material for the boron nitride aggregated particles is not particularly limited. Examples thereof include hexagonal boron nitride, cubic boron nitride, a boron nitride produced by a reduction nitriding method of a boron compound and ammonia, a boron nitride produced from a boron compound and a nitrogen-containing compound such as melamine, a boron nitride produced from sodium borohydride and ammonium chloride, and the like. From the viewpoint of much more effectively increasing the thermal conductance of the boron nitride aggregated particles, the boron nitride used as the material of the boron nitride aggregated particles is preferably hexagonal boron nitride.

Further, a granulation step is not always necessary in the method for producing the boron nitride aggregated particles. The boron nitride aggregated particles may be formed through the spontaneous gathering of primary particles of boron nitride as the boron nitride crystal grows. In addition, to make the boron nitride aggregated particles have a uniform particle size, pulverized boron nitride aggregated particles may be used.

The compressive strength of the plate-like inorganic particles when compressed by 20% is preferably 0.8 N/mm$^2$ or more, and more preferably 1.0 N/mm$^2$ or more. Further, this compressive strength is preferably 2.5 N/mm$^2$ or less, and more preferably 2.0 N/mm² or less. By setting to the above range, the particles can be easily crushed during pressing, the shape deforms so that the air present at the filler interface can be expelled, and the electrical insulation properties can be further increased.

In the present invention, the compressive strength can be measured as follows.

First, using a micro-compression tester, a smooth end surface of a diamond prism serving as a compression member is lowered toward the inorganic filler to compress the inorganic filler. A relationship between compression load value and compression displacement is obtained as the measurement result. The compression load value per unit area is calculated using the average cross-sectional area calculated using the particle size of the inorganic filler, and the calculated value is taken as the compressive strength. Further, the compressibility is calculated from the compressive displacement and the particle size of the inorganic filler to obtain a relationship between compressive strength and compressibility. The inorganic filler to be measured is observed with a microscope, and the inorganic filler having a particle size of particle size ±10% is selected and measured. In addition, the compressive strength at each compressibility is calculated as an average compressive strength obtained by averaging the results of 20 measurements. As the micro-compression tester, for example, a "Micro-compression tester HM2000" manufactured by Fischer Instruments K.K., is used. The compressibility can be calculated by (compressibility=compression displacement/average particle size×100).

The plate-like inorganic particles have an aspect ratio of preferably 3 or more, more preferably 4 or more, and further preferably 6 or less. By setting the aspect ratio to 3 or more, the major axis of the primary particles of the agglomerated boron nitride particles becomes long, and thermal conductance can be maintained.

Further, for the primary particles of the plate-like inorganic particles, from the viewpoint of suitably increasing the thermal conductivity, the average major axis, which is the average of the major axes, is preferably 2.5 μm or more, and more preferably 5 μm or more, and is preferably 30.0 μm or less, and more preferably 20 μm or less. It is noted that the average major axis means the average of 100 major axes determined in the above-described measurement of the aspect ratio.

In the present invention, the aspect ratio means major axis/minor axis. In the present specification, the aspect ratio is an average aspect ratio. Specifically, the aspect ratio is determined by observing 50 arbitrarily selected particles with an electron microscope or an optical microscope, and calculating the average value of the major axis/minor axis of those particles.

From the viewpoint of much more effectively increasing the electrical insulation properties and the thermal conductance, the average particle size of the plate-like inorganic particles is preferably 5 μm or more, and more preferably 20 μm or more, and is preferably 100 μm or less, and more preferably 80 μm or less.

In the present invention, the average particle size is preferably an average particle size obtained by averaging particle sizes in terms of volume. The average particle size can be measured using a "laser diffraction type particle size distribution measurement device" manufactured by HORIBA, Ltd. Regarding the method for calculating the average particle size, it is preferable to employ the particle size (d50) of the inorganic filler when the cumulative volume is 50% as the average particle size.

Examples of the inorganic particles A include alumina, synthetic magnesite, silica, aluminum nitride, silicon nitride, silicon carbide, zinc oxide, magnesium oxide, talc, mica, hydrotalcite, and the like. It is preferable to select the inorganic particles A from among these according to the desired relative permittivity. For example, when a high relative permittivity is required, it is preferable to select alumina or aluminum nitride, and when a medium relative permittivity is required, it is preferable to select magnesium oxide. When a low relative permittivity is required, it is preferable to select boron nitride.

It is noted that from the viewpoint of thermal conductance, among the inorganic particles A, alumina (particularly spherical alumina and shredded alumina) and spherical aluminum nitride are preferable, and spherical alumina is more preferable.

In particular, in order to increase thermal conductivity and further increase adhesive properties (peel strength), it is preferable to use inorganic particles A in which many functional groups having a high affinity with the resin are present on the surface of the particles. For example, alumina, (particularly spherical alumina and shredded alumina), spherical aluminum nitride, magnesium oxide, and silicon nitride are more preferable, and spherical alumina is further preferable.

The aspect ratio of the inorganic particles A is preferably 2 or less, and more preferably 1.9 or less, and is preferably 0.1 or more. By setting the aspect ratio to 2 or less, the particles rotate more easily during application and can enter gaps between the inorganic particles B and the plate-like inorganic particles.

From the viewpoint of much more effectively increasing the electrical insulation properties and the thermal conductance, the average particle size of the inorganic particles A is preferably 0.1 nm or more, and more preferably 0.3 nm or more. Further, the average particle size is preferably 50 nm or less, more preferably 40 nm or less, further preferably 20 nm or less, and still further preferably 18 nm or less.

The inorganic particles B are preferably a boron nitride. Examples thereof include hexagonal boron nitride, cubic boron nitride, a boron nitride produced by a reduction nitriding method of a boron compound and ammonia, a boron nitride produced from a boron compound and a nitrogen-containing compound such as melamine, a boron nitride produced from sodium borohydride and ammonium chloride, and the like. From the viewpoint of much more effectively increasing the thermal conductance, the boron nitride is preferably hexagonal boron nitride.

From the viewpoint of much more effectively increasing the electric insulation properties and the thermal conductance, the inorganic particles B are preferably boron nitride aggregated particles. These boron nitride aggregated particles are the same as the plate-like inorganic particles.

The aspect ratio of the inorganic particles B is preferably 3 or more, and more preferably 4 or more, and is preferably 10 or less. By setting the aspect ratio to 3 or more, the major axis of the primary particles of the agglomerated boron nitride particles becomes long, and thermal conductance can be maintained.

Further, the average major axis of the primary particles of the inorganic particles B is, from the viewpoint of improving filling properties and suitably improving the thermal conductivity, preferably 0.5 μm or more, and more preferably 0.8 μm or more, and is preferably 15 μm or less, and more preferably 13 μm or less.

The compressive strength of the inorganic particles B when compressed by 20% is, from the viewpoint that the shape can be maintained without crushing during pressing and the thermal conductance can be maintained, preferably 2 N/mm² or more, and more preferably 2.5 N/mm² or more, and is preferably 15 N/mm² or less, and more preferably 13 N/mm² or less.

The average particle size of the inorganic particles B is, from the viewpoint of much more effectively increasing the electrical insulation properties and the thermal conductance, preferably 20 µm or more, and more preferably 30 µm or more, and is 90 µm or less, and more preferably 70 µm or less.

The content of the plate-like inorganic particles in the inorganic filler is, from the viewpoint of effectively increasing the thermal conductivity, preferably 1% by volume or more, and more preferably 3% by volume or more, and is preferably 100% by volume or less, and more preferably 90% by volume or less.

Further, the content of the inorganic particles A in the inorganic filler is preferably 1% by volume or more, and more preferably 3% by volume or more, and is preferably 50% by volume or less, and more preferably 45% by volume or less.

In addition, the content of the inorganic particles B in the inorganic filler is preferably 1% by volume or more, and more preferably 3% by volume or more, and is preferably 90% by volume or less, and more preferably 85% by volume or less.

Still further, the content of the inorganic filler in the resin composition layer is preferably 20% by volume or more, and more preferably 30% by volume or more, and is preferably 90% by volume or less, and more preferably 80% by volume or less.

The compressive strength of the inorganic particles B when compressed by 20% is larger than that of the plate-like inorganic particles, and is preferably 1.5 N/mm² or more.

In addition, to the components described above, the resin composition layer may include other components, such as a dispersant, a chelating agent, and an antioxidant.

Further, the resin composition layer is formed by, for example, when using an epoxy resin, semi-curing or curing a resin composition including the above-described inorganic filler, epoxy compound, thermal curing agent, and the like. From the viewpoint of adjusting the viscosity, the resin composition may contain a solvent. The solvent is not particularly limited, and examples thereof include toluene, methyl ethyl ketone, and the like. These can be used alone or in combination of two or more kinds.

The resin composition layer of the electrical insulation sheet of the present invention may be a structure in which the resin composition layer is one layer or a structure in which the resin composition layer is composed of at least two layers, such as a first resin composition layer and a second resin composition layer. In this case, the relative permittivity at a frequency of 1 MHz of the first resin composition layer including one surface is higher than the relative permittivity of the second resin composition layer including the other surface.

Further, the resin composition layer may be a structure composed of at least three layers, in which a third resin composition layer is on the other surface side of the second resin composition layer.

In all of these structures, it is preferable that at least any one of the first resin composition, the second resin composition layer, and the third resin composition layer include an epoxy resin and an inorganic filler.

FIG. 1 illustrates an example of a laminated body 10 using an electrical insulation sheet in which the resin composition layer has one layer (a single layer). In FIG. 1, an electrical insulation sheet composed of one resin composition layer 14 is provided between a metal plate 12 and a metal base plate 16.

In this case, the thickness of the resin composition layer 14 is preferably 30 µm or more, and more preferably 50 µm or more, and is preferably 300 µm or less, and more preferably 280 µm.

It is noted that in the case of such an electrical insulation sheet, one surface side is an upper surface 14X side of the resin composition layer 14, and the other surface side is a lower surface 14Y side of the resin composition layer 14.

Figure 2:
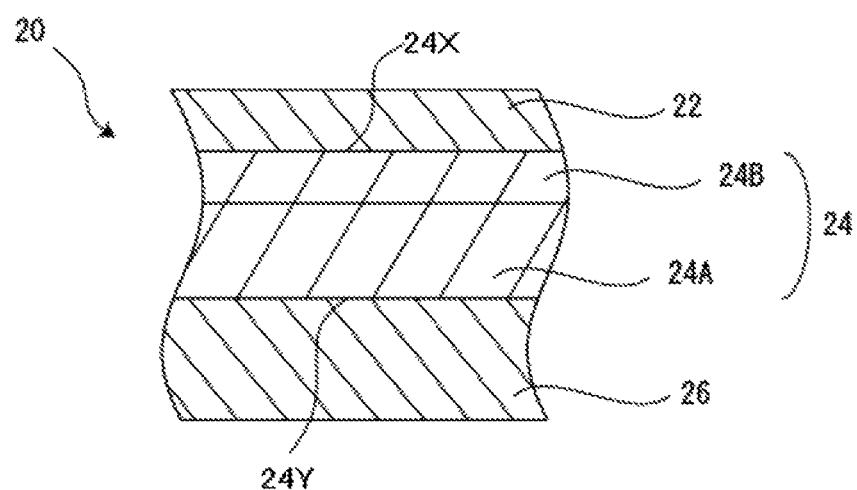
FIG. 2 is a cross-sectional view schematically illustrating a laminated body according to another embodiment of the present invention.

FIG. 2 illustrates an example of a laminated body 20 using an electrical insulation sheet in which the resin composition layer has a two-layer structure. In FIG. 2, an electrical insulation sheet composed of a resin composition layer 24 having, in order from a metal base plate 26 side, a resin composition layer 24A (second resin composition layer) and a resin composition layer 24B (first resin composition layer) is provided between a metal plate 22 and the metal base plate 26. Using a resin composition layer having at least two layers enables the relative permittivity to be changed between the upper and lower layers.

Further, in the case of the mode described above, the thickness of the first resin composition layer is preferably smaller than the thickness of the second resin composition layer, and the thickness of the first layer is preferably ⅖ or less, and more preferably ⅓ or less, of the thickness of the second layer. As a result, electric field concentration can be further alleviated and the electrical insulation properties can be further improved.

It is also noted that in the case of such an electrical insulation sheet, one surface side is an upper surface 24X side (metal plate 22 side) of the resin composition layer 24B, and the other surface side is a lower surface 24Y side (metal base plate 26 side) of the resin composition layer 24A.

Figure 3:
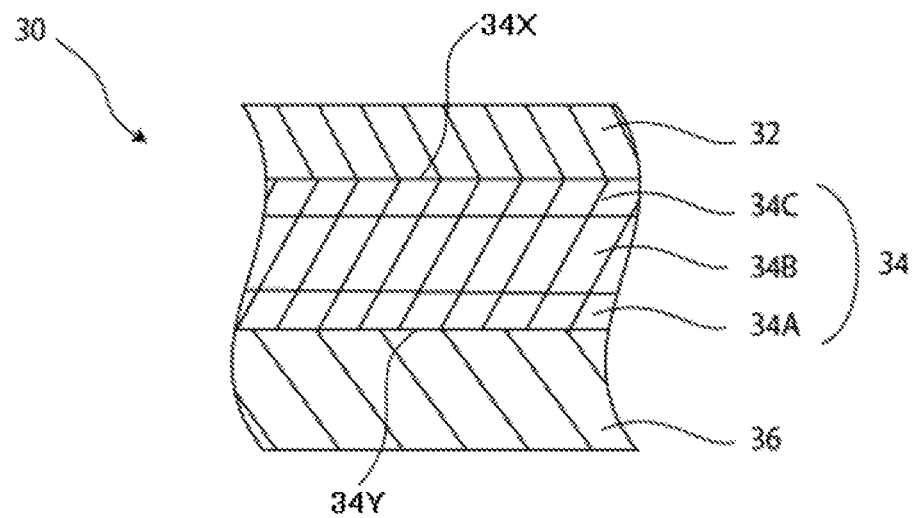
FIG. 3 is a cross-sectional view schematically illustrating a laminated body according to another embodiment of the present invention.

In addition, FIG. 3 illustrates an example of a laminated body 30 using an electrical insulation sheet in which the resin composition layer has a three-layer structure. That is, an electrical insulation sheet composed of a resin composition layer 34 having, in order from a metal base plate 36 side, a resin composition layer 34A (third resin composition layer), a resin composition layer 34B (second resin composition layer), and a resin composition layer 34C (first resin composition layer) is provided between a metal plate 32 and the metal base plate 36. Using a resin composition layer having at least three layers enables the relative permittivity to be reduced in a step-like manner among an upper layer, an intermediate layer, and a lower layer, so that the relative permittivity can be gradually reduced from one surface side to the other surface side. As a result, even higher electrical insulation properties can be exhibited.

It is noted that in the case of such an electrical insulation sheet, one surface side is an upper surface 34X side (metal plate 32 side) of the resin composition layer 34C, and the other surface side is a lower surface 34Y side (metal base plate 36 side) of the resin composition layer 34A.

Here, when the resin composition layer has a two-layer structure, the resin composition layer 24A may include the plate-like inorganic particles, and the resin composition layer 24B may include inorganic particles A and inorganic particles B, or, the resin composition layer 24A may include the inorganic particles A and the inorganic particles B, and the resin composition layer 24B may include the plate-like inorganic particles.

In a preferable structure, the resin composition layer 24A includes the plate-like inorganic particle, and in a more preferable structure, the resin composition layer 24A contains the plate-like inorganic particles and the resin composition layer 24B includes the inorganic particle A and the inorganic particles B.

When the plate-like inorganic particles and the inorganic particles B are boron nitride aggregated particles, the inorganic particles A are alumina particles, and the 20% compressive strength of the plate-like inorganic particles is lower than the 20% compressive strength of the inorganic particles B, it is possible to improve the adhesive properties between the metal plate 22 and the resin composition layer 24B while further improving the thermal conductivity and the electrical insulation properties.

When the resin composition layer 24A contains the plate-like inorganic particles and the resin composition layer 24B contains the inorganic particles A and the inorganic particles B, the content of the plate-like inorganic particles in the resin composition layer 24A is preferably 3% by volume or more, and more preferably 5% by volume or more, and is preferably 90% by volume or less, and more preferably 85% by volume. At this time, the epoxy resin content is preferably 5% by volume or more, and more preferably 10% by volume or more, and is preferably 60% by volume or less, and more preferably 50% by volume or less.

The content of the inorganic particles A in the resin composition layer 24B is preferably 1% by volume or more, and more preferably 3% by volume or more, and is preferably 60% by volume or less, and more preferably 50% by volume or less. The content of the inorganic particles B is preferably 1% by volume or more, and more preferably 3% by volume or more, and is preferably 90% by volume or less, and more preferably 85% by volume or less. At this time, the epoxy resin content is preferably 5% by volume or more, and more preferably 10% by volume or more, and is preferably 60% by volume or less, and more preferably 50% by volume or less.

It is noted that even when the resin composition layer has a two-layer structure, the total content of the inorganic filler in each layer, including the plate-like inorganic particles, the inorganic particles A, and the inorganic particles B, and the total amount of the epoxy resin in each layer is the same as in the case where the resin composition layer is one layer.

When the resin composition layer has a two-layer structure, the thickness of the resin composition layer 24A on the metal base plate side is preferably 20 μm or more, and more preferably 50 μm or more, and is preferably 170 μm or less, and more preferably 150 μm or less. The thickness of the resin composition layer 24B on the metal plate side is preferably 10 μm or more, and more preferably 20 μm or more, and is preferably 150 μm or less, and more preferably 130 μm or less. At this time, the thickness of the resin composition layer 24B is preferably smaller than the thickness of the resin composition layer 24A on the metal base plate side.

It is noted that when the resin composition layer is a structure having two or more layers, the total thickness of each of those layers is the same as when the resin composition layer is one layer. This total thickness is preferably 30 μm or more, and more preferably 50 μm or more, and is preferably 320 μm or less, and more preferably 280 μm or less.

When the resin composition layer has a two-layer structure, for example, the resin composition (for example, containing an inorganic filler having a low relative permittivity) to be the second resin composition layer is applied onto a metal base plate and optionally semi-cured, and then the resin composition (for example, containing an inorganic filler having a high relative permittivity) to be the first resin composition layer is applied thereon and optionally semi-cured. A metal plate can then be pasted thereon and the plates pressed together to produce a two-layer structure. In addition, the two-layer structure may also be produced by sandwiching both sides of a laminated sheet consisting of a sheet composed of a resin composition to be the first resin composition layer and a sheet composed of a resin composition to be the second resin composition layer between a metal base plate and a metal plate and pressing.

Further, when the resin composition layer has a three-layer structure, the plate-like inorganic particles, the inorganic particles A, and the inorganic particles B mixed in the resin composition layers 34A, 34B, and 34C can be selected as appropriate from the viewpoint of obtaining the desired relative permittivity.

As a first example of a three-layer structure, the resin composition layer 34A (third resin composition layer) includes the plate-like inorganic particles, the inorganic particles A, and the inorganic particles B, the resin composition layer 34B (second resin composition layer) includes the plate-like inorganic particles, and the resin composition layer 34C (first resin composition layer) includes the inorganic particles A and the inorganic particles B.

As a second example of a three-layer structure, the resin composition layer 34A (third resin composition layer) includes the plate-like inorganic particles, the resin composition layer 34B (second resin composition layer) includes the plate-like inorganic particles, the inorganic particles A, and the inorganic particles B, and the resin composition layer 34C (first resin composition layer) includes the inorganic particles A and the inorganic particles B.

Of the first and second examples of the above-described three-layer structure, the first example is preferable.

Even when the resin composition layer has a three-layer structure, when the plate-like inorganic particles and the inorganic particles B are boron nitride aggregated particles, the inorganic particles A are alumina particles, and the 20% compressive strength of the plate-like inorganic particles is lower than the 20% compressive strength of the inorganic particles B, it is possible to improve the adhesive properties between the metal plate 32 and the resin composition layer 34B while further improving the thermal conductivity and the electrical insulation properties.

In the case of the first example of a three-layer structure, the content of the plate-like inorganic particles in the resin composition layer 34A (third resin composition layer) is preferably 10% by volume or more, and more preferably 15% by volume or more, and is preferably 80% by volume or less, and more preferably 70% by volume. The content of the inorganic particles A is preferably 10% by volume or more, and more preferably 20% by volume or more, and is preferably 70% by volume or less, and more preferably 60% by volume or less. The content of the inorganic particles B is preferably 10% by volume or more, and more preferably 20% by volume or more, and is preferably 80% by volume or less, and more preferably 70% by volume or less. At this time, the epoxy resin content is preferably 10% by volume or more, and more preferably 20% by volume or more, and is preferably 70% by volume or less, and more preferably 50% by volume or less.

The content of the plate-like inorganic particles in the resin composition layer 34B (second resin composition layer) is preferably 20% by volume or more, and more preferably 30% by volume or more, and is preferably 85% by volume or less, and more preferably 75% by volume or less. At this time, the epoxy resin content is preferably 10% by volume or more, and more preferably 20% by volume or more, and is preferably 50% by volume or less, and more preferably 70% by volume or less.

The content of the inorganic particles A in the resin composition layer 34C (first resin composition layer) is preferably 5% by volume or more, and more preferably 10% by volume or more, and is preferably 80% by volume or less, and more preferably 70% by volume or less. The content of the inorganic particles B is preferably 10% by volume or more, and more preferably 15% by volume or more, and is preferably 70% by volume or less, and more preferably 50% by volume or less. At this time, the epoxy resin content is preferably 10% by volume or more, and more preferably 20% by volume or more, and is preferably 70% by volume or less, and more preferably 50% by volume or less.

In the case of the second example of a three-layer structure, the content of the plate-like inorganic particles in the resin composition layer 34A (third resin composition layer) is preferably 10% by volume or more, and more preferably 20% by volume or more, and is preferably 85% by volume or less, and more preferably 75% by volume. At this time, the epoxy resin content is preferably 10% by volume or more, and more preferably 20% by volume or more, and is preferably 70% by volume or less, and more preferably 50% by volume or less.

The content of the plate-like inorganic particles in the resin composition layer 34B (second resin composition layer) is preferably 10% by volume or more, and more preferably 20% by volume or more, and is preferably 80% by volume or less, and more preferably 70% by volume or less. The content of the inorganic particles A is preferably 10% by volume or more, and more preferably 20% by volume or more, and is preferably 80% by volume or less, and more preferably 70% by volume or less. The content of the inorganic particles B is preferably 5% by volume or more, and more preferably 15% by volume or more, and is preferably 80% by volume or less, and more preferably 70% by volume or less. At this time, the epoxy resin content is preferably 10% by volume or more, and more preferably 20% by volume or more, and is preferably 50% by volume or less, and more preferably 70% by volume or less.

The content of the inorganic particles A in the resin composition layer 34C (first resin composition layer) is preferably 5% by volume or more, and more preferably 10% by volume or more, and is preferably 80% by volume or less, and more preferably 60% by volume. The content of the inorganic particles B is preferably 10% by volume or more, and more preferably 20% by volume or more, and is preferably 80% by volume or less, and more preferably 70% by volume or less. At this time, the epoxy resin content is preferably 10% by volume or more, and more preferably 20% by volume or more, and is preferably 70% by volume or less, and more preferably 50% by volume or less.

It is noted that even when the resin composition layer has a three-layer structure, the total content of the inorganic filler in each layer, including the plate-like inorganic particles, the inorganic particles A, and the inorganic particles B, and the total amount of the epoxy resin in each layer is the same as in the case where the resin composition layer has one layer.

When the resin composition layer has a three-layer structure, the thickness of the resin composition layer 34C is preferably 10 μm or more, and more preferably 20 μm or more, and is preferably 100 μm or less, and more preferably 60 μm or less.

The thickness of the resin composition layer 34B is preferably 20 μm or more, and more preferably 30 μm or more, and is preferably 170 μm or less, and more preferably 160 μm or less.

The thickness of the resin composition layer 34A is preferably 10 μm or more, and more preferably 20 μm or more, and is preferably 100 μm or less, and more preferably 60 μm or less.

From the viewpoint of electrical insulation properties, the thickness of the resin composition layer 34A (third resin composition layer) is preferably smaller than the thickness of the resin composition layer 34B (second resin composition layer). The thickness of the third resin composition layer is preferably ⅖ or less of the thickness of the second resin composition layer, and more preferably ⅓ or less. This can further alleviate electric field concentration and further improve the electrical insulation properties.

It is noted that when the resin composition layer has a structure having three or more layers, the total thickness of each of those layers is the same as when the resin composition layer is one layer. This total thickness is preferably 30 μm or more, and more preferably 50 μm or more, and is preferably 320 μm or less, and more preferably 280 μm or less.

When the resin composition layer has a three-layer structure, for example, the resin composition (for example, having a low relative permittivity) to be the third resin composition layer is applied onto a metal base plate and optionally semi-cured, and then the resin composition (for example, having a medium relative permittivity) to be the second resin composition layer is applied thereon and optionally semi-cured. Then, the resin composition (for example, having a high relative permittivity) to be the first resin composition layer is applied onto the second resin composition layer and optionally semi-cured. A metal plate can then be pasted thereon and the plates pressed together to produce a three-layer structure. In addition, the three-layer structure may also be produced by sandwiching both sides of a laminated sheet consisting of a sheet composed of a resin composition to be the first resin composition layer, a sheet composed of a resin composition to be the second resin composition layer, and a resin composition composed of a resin composition to be the third resin composition layer between a metal base plate and a metal plate and pressing.

The electrical insulation sheet of the present invention as described above can be used as an electrical insulation circuit substrate by sandwiching it between a metal plate and a metal base plate to form a laminated plate, and then forming a circuit on the metal plate by a method such as etching.

[Laminated Body and Substrate]

The laminated body of the present invention includes the electrical insulation sheet of the present invention and a metal plate in that order on a metal base plate. Further, a circuit pattern is formed on the metal plate. A known method can be applied as the method for laminating these. Examples of the laminated body of the present invention include, but are not limited to, the laminated bodies illustrated in FIG. 1 to FIG. 3.

In addition, the substrate of the present invention includes the electrical insulation sheet of the present invention and a metal plate in that order on a metal base plate, and the metal plate has a circuit pattern. That is, the substrate of the present invention can be said to be a substrate having a circuit pattern formed on a metal plate of the laminated body of the present invention. A method such as etching can be used as the method for forming the circuit pattern.

Since the metal base plate and the metal plate both exhibit a function as a heat conductor, their thermal conductivity is preferably 10 W/(m·K) or more. Examples of materials that can be used for the metal base plate and the metal plate include aluminum, copper, gold, silver, and graphite sheets. From the viewpoint of much more effectively increasing the thermal conductance, aluminum, copper, or gold is preferable, and aluminum or copper is more preferable.

The thickness of the metal base plate is preferably 0.1 to 5 mm. The thickness of the metal plate is preferably 10 to 2000 μm, and more preferably 10 to 900 μm. It is noted that the metal plate may be a plate such as a copper plate or a foil such as a copper foil.

EXAMPLES

The present invention will now be described more specifically with reference to examples and Comparative Examples, but the present invention is not limited thereto.

Example 1

Production of Resin Composition
(1) Resin Composition A:
38.3% by volume of aggregated boron nitride particles as the inorganic particles B, 24.9% by volume of alumina particles, 33.2% by volume of an epoxy compound, 2.0% by volume of a curing agent, and 1.6% by volume of a dispersant were mixed together to obtain a resin composition A. The details of these materials are as follows.
Aggregated boron nitride particles as inorganic particles B: UHP-G1H, manufactured by Showa Denko K.K., 20% compressive strength 4.2 N/mm$^2$ Alumina particles: AS50, manufactured by Showa Denko K.K., aspect ratio 2 Epoxy compound: YD127, manufactured by Nippon Steel & Sumitomo Metal Corporation.
Curing agent: 2P4MZ, manufactured by SHIKOKU CHEMICALS CORPORATION.
Dispersant: KBM403, manufactured by Shin-Etsu Chemical Co., Ltd.
(2) Resin Composition B:
67.5% by volume of aggregated boron nitride particles as plate-like inorganic particles, 29.3% by volume of an epoxy compound, 2.0% by volume of a curing agent, and 1.2% by volume of a dispersant were mixed together to obtain a resin composition B. The details of these materials are as follows.
Aggregated boron nitride particles as plate-like inorganic particles: HP-40, manufactured by Mizushima Ferroalloy Co., Ltd., 20% compressive strength 1.7 N/mm$^2$
Epoxy compound: YD127, manufactured by Nippon Steel & Sumitomo Metal Corporation.
Curing agent: 2P4MZ, manufactured by SHIKOKU CHEMICALS CORPORATION.
Dispersant: KBM403, manufactured by Shin-Etsu Chemical Co., Ltd.
Production of Electrical Insulation Sheet
The resin composition A was applied on a release PET sheet (thickness 40 μm). Further, the resin composition B was applied on a release PET sheet (thickness 40 μm). Table 1 shows the thickness ratio of the resin composition layers of these sheets. The applied resin compositions A and B were dried in an oven at 50° C. for 10 minutes to preliminarily cure them. Next, the preliminarily cured sheets were laminated so that the release PET sheets were on the external side, and then the release PET sheets were peeled off. Both sides of the obtained laminate were sandwiched by a copper foil (thickness 35 μm) and an aluminum plate (thickness 1.0 mm), and heated at 110° C. for 30 minutes to preliminarily cure them, thereby obtaining a pre-curing sheet. It is noted that the layer including the resin composition A (first resin composition layer) was formed on the copper foil side, and the layer including the resin composition B (second resin composition layer) was formed on the aluminum plate side. The obtained pre-curing sheet was vacuum-pressed for 60 minutes at a temperature of 195° C. and a pressure of 8 MPa to obtain a laminated body in which a copper foil was laminated on the first resin composition layer of an electrical insulation sheet composed of a first resin composition layer and a second resin composition layer and an aluminum plate was laminated on the second resin composition layer. It is also noted that the thickness of the resin composition layer composed of the first resin composition layer and the second resin composition layer (thickness of the electrical insulation sheet) was 150 μm.

Examples 2 and 3

Electrical insulation sheets were obtained in the same manner as in Example 1, except that the thickness ratio between the first resin composition layer and the second resin composition layer (second resin composition layer/first resin composition layer) was changed to that shown in Table 1 below.

Example 4

Production of Resin Composition
Resin composition C:
33.8% by volume of aggregated boron nitride particles as plate-like inorganic particles, 24.9% by volume of alumina particles, 19.1% by volume of aggregated boron nitride particles as the inorganic particles B, 29.3% by volume of an epoxy compound, 2.0% by volume of a curing agent, and 1.2% by volume of a dispersant were mixed together to obtain a resin composition C. The details of these materials are as follows.
Aggregated boron nitride particles as plate-like inorganic particles: HP-40, manufactured by Mizushima Ferroalloy Co., Ltd., 20% compressive strength 1.7 N/mm$^2$
Aggregated boron nitride particles as inorganic particles B: UHP-G1H, manufactured by Showa Denko K.K., 20% compressive strength 4.2 N/mm$^2$ Alumina particles: AS50, manufactured by Showa Denko K.K., aspect ratio 2 Epoxy compound: YD127, manufactured by Nippon Steel & Sumitomo Metal Corporation.
Curing agent: 2P4MZ, manufactured by SHIKOKU CHEMICALS CORPORATION.
Dispersant: KBM403, manufactured by Shin-Etsu Chemical Co., Ltd.
Production of Electrical Insulation Sheet
The resin composition A was applied on a release PET sheet (thickness 40 μm). Further, the resin composition B was applied on a release PET sheet (thickness 40 μm). In addition, the resin composition C was applied on a release PET sheet (thickness 40 μm). Table 1 shows the thickness ratio of the resin composition layers of these sheets. The applied resin compositions A and B were dried in an oven at 50° C. for 10 minutes to preliminarily cure them.
Next, the preliminarily cured sheets were laminated so that, among the preliminarily cured sheets, the release PET sheet on which the resin composition A had been applied and the release PET sheet on which the resin composition B had been applied were each on the external side, and the release PET sheet on which the resin composition B had been applied was peeled off. Then, on the surface of the resin composition B, whose release PET sheet had been peeled off to expose its surface, the release PET sheet on which the resin composition C had been applied was laminated so that the release PET sheet was on the external side. The release PET sheets provided on both sides were peeled off, then both sides of the obtained laminate were sandwiched by a copper foil (thickness 40 µm) and an aluminum plate (thickness 1.0 mm), and heated at 110° C. for 30 minutes to preliminarily cure them, thereby obtaining a pre-curing sheet.

It is noted that the layer including the resin composition A (first resin composition layer) was formed on the copper foil side, and the layer including the resin composition C (third resin composition layer) was formed on the aluminum plate side. The obtained pre-curing sheet was vacuum-pressed for 60 minutes at a temperature of 195° C. and a pressure of 8 MPa to obtain a laminated body in which a copper foil was laminated on the first resin composition layer of an electrical insulation sheet composed of a first resin composition layer, a second resin composition layer, and a third resin composition layer and an aluminum plate was laminated on the third resin composition layer. It is also noted that the thickness of the resin composition layer composed of the first resin composition layer, the second resin composition layer, and the third resin composition layer (thickness of the electrical insulation sheet) was 200 µm.

Example 5

Production of Electrical Insulation Sheet

A pre-curing sheet was obtained in the same manner as in Example 4, except that the layer including the resin composition A (first resin composition layer) was formed on the copper foil side, the layer including the resin composition B (third resin composition layer) was formed on the aluminum plate side, the layer containing the resin composition C (second resin composition layer) was formed between those layers, and the thickness ratio was as shown in Table 1. The obtained pre-curing sheet was vacuum-pressed for 60 minutes at a temperature of 195° C. and a pressure of 8 MPa to obtain a laminated body in which a copper foil was laminated on the first resin composition layer of an electrical insulation sheet composed of a first resin composition layer, a second resin composition layer, and a third resin composition layer and an aluminum plate was laminated on the third resin composition layer. It is also noted that the thickness of the resin composition layer composed of the first resin composition layer, the second resin composition layer, and the third resin composition layer (thickness of the electrical insulation sheet) was 200 µm.

Comparative Example 1

An electrical insulation sheet was obtained in the same manner as in Example 1, except that only the second resin composition layer was used as the resin composition layer. It is noted that the total thickness of the resin composition layer (thickness of the electrical insulation sheet) is the same as in Example 1.

Comparative Example 2

An electrical insulation sheet was obtained in the same manner as in Example 1, except that only the first resin composition layer was used as the resin composition layer. It is noted that the total thickness of the resin composition layer (thickness of the electrical insulation sheet) is the same as in Example 1.

Comparative Example 3

The resin composition C was applied on each of two release PET sheets (thickness 40 µW. Table 2 shows the thickness ratio of the resin composition layers of these sheets. The applied resin compositions C were dried in an oven at 50° C. for 10 minutes to preliminarily cure them.

Next, the preliminarily cured sheets were laminated so that the release PET sheets were on the external side, and then the release PET sheets were peeled off. Both sides of the obtained laminate were sandwiched by a copper foil (thickness 40 µm) and an aluminum plate (thickness 1.0 mm), and heated at 110° C. for 30 minutes to preliminarily cure them, thereby obtaining a pre-curing sheet. The obtained pre-curing sheet was vacuum-pressed for 60 minutes at a temperature of 195° C. and a pressure of 8 MPa to obtain a laminated body in which a copper foil was laminated on the first resin composition layer of an electrical insulation sheet composed of a first resin composition layer and a second resin composition layer and an aluminum plate was laminated on the second resin composition layer. It is also noted that the first resin composition layer and the second resin composition layer had the same composition. Further, the total thickness of the resin composition layer (thickness of the electrical insulation sheet) was the same as in Example 1.

Comparative Example 4

An electrical insulation sheet was obtained in the same manner as in Example 1, except that the layer containing the resin composition B (first resin composition layer) was formed on the copper foil side, and the layer containing the resin composition A (second resin composition layer) was formed on the aluminum plate side.

It is noted that the total thickness of the resin composition layer (thickness of the electrical insulation sheet) was the same as in Example 1.

Comparative Examples 5 and 6

Electrical insulation sheets were obtained in the same manner as in Comparative Example 4, except that the thickness ratio between the first resin composition layer and the second resin composition layer (second resin composition layer/first resin composition layer) was changed as shown in Table 3 below.

It is noted that the total thickness of the resin composition layer (thickness of the electrical insulation sheet) was the same as in Example 1.

Comparative Example 7

Production of electrical insulation sheet

A pre-curing sheet was obtained in the same manner as in Example 4, except that the layer including the resin composition B (first resin composition layer) was formed on the copper foil side, the layer including the resin composition C (third resin composition layer) was formed on the aluminum plate side, the layer containing the resin composition A (second resin composition layer) was formed between those layers, and the thickness ratio was as shown in Table 1. The obtained pre-curing sheet was vacuum-pressed for 60 minutes at a temperature of 195° C. and a pressure of 8 MPa to obtain a laminated body in which a copper foil was laminated on the first resin composition layer of an electrical insulation sheet composed of a first resin composition layer, a second resin composition layer, and a third resin composition layer and an aluminum plate was laminated on the third resin composition layer. It is also noted that the thickness of the resin composition layer composed of the first resin composition layer, the second resin composition layer, and the third resin composition layer (thickness of the electrical insulation sheet) was 200 μm.

(Relative Permittivity Measurement)

The release PET sheets on both sides of the sheets that were preliminarily cured in the "production of electrical insulation sheet" of each example were peeled off. Both sides of the obtained laminate were sandwiched by a copper foil (thickness 40 μm) and an aluminum plate (thickness 1.0 mm), and heated at 110° C. for 30 minutes to preliminarily cure them, thereby obtaining a pre-curing sheet. The obtained pre-curing sheet was vacuum-pressed for 60 minutes at a temperature of 195° C. and a pressure of 8 MPa to obtain a sample sheet. The obtained sample sheet was cut into 40 mm×40 mm, and a ϕ 20 mm pattern was etched thereon. The etching depth was 10% in the thickness direction. Then, the relative permittivity was measured with an LCR (impedance) analyzer PSM 3750 manufactured by IWATSU ELECTRIC CO., LTD., at room temperature (25° C.) in air at 33 points for one cycle by dividing a frequency from 100 mHz to 10 MHz on a log scale. The relative permittivity at a frequency of 1 MHz was obtained by reading the obtained waveform.

(Measurement of Thermal Conductivity)

The thermal conductivity was measured by a laser flash method using a measurement sample obtained by cutting each electrical insulation sheet of the Examples and Comparative Examples into 1 cm squares and spraying carbon black on both sides thereof. The results are shown in Tables 1 to 3 below.

[Thermal Conductivity Determination Criteria]
A: 10 W or more
B: 8 W or more and less than 10 W
C: Less than 8 W (Electrical Breakdown Voltage Measurement)

Each electrical insulation sheet of the Examples and the Comparative Examples was cut into 90 mm×50 mm, and a ϕ 20 mm pattern was etched thereon. Then, an alternating voltage was applied so that voltage increased at a rate of 0.5 kV/min in the test sample using a withstand voltage tester ("MODEL 7473" manufactured by Extech Electronics Co.). The voltage at which the test sample broke down was taken as the electrical breakdown voltage (BDV). The results are shown in Tables 1 to 3 below. The electrical insulation properties were determined based on the following criteria. It is noted that the thickness of the resin composition layer (electrical insulation layer) that was measured was 150 μm.

[Electrical Insulation Properties Determination Criteria]
AA: Electrical breakdown voltage is 10 kV or more
A: Electrical breakdown voltage is more than 8 kV and less than 10 kV
B: Electrical breakdown voltage is 6 kV or more and less than 8 kV
C: Electrical breakdown voltage is less than 6 kV (90° Peel Strength (Adhesive Properties))

The laminated bodies obtained in the Examples and Comparative Examples were cut into a size of 50 mm×120 mm to obtain test samples. The obtained test samples were peeled so as to leave only a 10 mm-wide portion in the center of the copper foil. The peel strength of the 35 μm copper foil was measured for the 10 mm-wide portion in the center of the copper foil in accordance with JIS C6481. As the peel strength measurement device, a "Tensilon universal testing machine" manufactured by ORIENTEC CORPORATION was used. The peel strength was determined based on the following criteria. The results are shown in Tables 1 to 3 below.

[Peel Strength Criteria]
A: Peel strength is 6 N/cm or more
C: Peel strength is less than 6 N/cm

TABLE 1

| | | | Example 1 Structure of resin composition layer | | Example 2 Structure of resin composition layer | | Example 3 Structure of resin composition layer | |
|---|---|---|---|---|---|---|---|---|
| | | | Second resin composition layer | First resin composition layer | Second resin composition layer | First resin composition layer | Second resin composition layer | First resin composition layer |
| Composition of each resin composition layer | Epoxy resin | | 29.3% by volume | 33.2% by volume | 29.3% by volume | 33.2% by volume | 29.3% by volume | 33.2% by volume |
| | Dispersant | | 1.2% by volume | 1.6% by volume | 1.2% by volume | 1.6% by volume | 1.2% by volume | 1.6% by volume |
| | Curing agent | | 2.0% by volume | 2.0% by volume | 2.0% by volume | 2.0% by volume | 2.0% by volume | 2.0% by volume |
| | Agglomerated boron nitride particles | Inorganic particles B (UHP-G1H) | — | 38.3% by volume | — | 38.3% by volume | — | 38.3% by volume |
| | | Plate-like inorganic particles (HP-40) | 67.5% by volume | — | 67.5% by volume | — | 67.5% by volume | — |
| | Alumina particles | Inorganic particles A (AS-50) | — | 24.9% by volume | — | 24.9% by volume | — | 24.9% by volume |
| Relative permittivity | | | 4 | 9 | 4 | 9 | 4 | 9 |
| Thickness ratio* | | | 1/1 | | 3/1 | | 1/3 | |
| Evaluation | Peel strength (N/cm) | | A | | A | | A | |
| | Thermal conductivity (W/(m·K)) | | A | | A | | B | |
| | BDV (kV) | | A | | AA | | A | |

TABLE 1-continued

|  |  | Example 4 Structure of resin composition layer | | | Example 5 Structure of resin composition layer | | |
| --- | --- | --- | --- | --- | --- | --- | --- |
|  |  | Third resin composition layer | Second resin composition layer | First resin composition layer | Third resin composition layer | Second resin composition layer | First resin composition layer |
| Composition of each resin composition layer | Epoxy resin | 29.3% by volume | 29.3% by volume | 33.2% by volume | 29.3% by volume | 29.3% by volume | 33.2% by volume |
|  | Dispersant | 1.2% by volume | 1.2% by volume | 1.6% by volume | 1.2% by volume | 1.2% by volume | 1.6% by volume |
|  | Curing agent | 2.0% by volume | 2.0% by volume | 2.0% by volume | 2.0% by volume | 2.0% by volume | 2.0% by volume |
|  | Agglomerated boron nitride particles — Inorganic particles B (UHP-G1H) | 19.1% by volume | — | 38.3% by volume | — | 19.1% by volume | 38.3% by volume |
|  | Plate-like inorganic particles (HP-40) | 33.8% by volume | 67.5% by volume | — | 67.5% by volume | 33.8% by volume | — |
|  | Alumina particles — Inorganic particles A (AS-50) | 24.9% by volume | — | 24.9% by volume | — | 24.9% by volume | 24.9% by volume |
| Relative permittivity |  | 5.5 | 4 | 9 | 4 | 5.5 | 9 |
| Thickness ratio* |  |  | 1/3/1 |  |  | 1/3/1 |  |
| Evaluation | Peel strength (N/cm) |  | A |  |  | A |  |
|  | Thermal conductivity (W/(m · K)) |  | A |  |  | A |  |
|  | BDV (kV) |  | AA |  |  | A |  |

*Thickness ratio: For a two-layer structure, second resin composition layer/first resin composition layer, and for a three-layer structure, third resin composition layer/second resin composition layer/first resin composition layer.

TABLE 2

|  |  | Comparative Example 1 Structure of resin composition layer | Comparative Example 2 Structure of resin composition layer | Comparative Example 3 Structure of resin composition layer | |
| --- | --- | --- | --- | --- | --- |
|  |  |  |  | Second resin composition layer | First resin composition layer |
| Composition of each resin composition layer | Epoxy resin | 29.3% by volume | 33.2% by volume | 29.3% by volume | 29.3% by volume |
|  | Dispersant | 1.2% by volume | 1.6% by volume | 1.2% by volume | 1.2% by volume |
|  | Curing agent | 2.0% by volume | 2.0% by volume | 2.0% by volume | 2.0% by volume |
|  | Agglomerated boron nitride particles — Inorganic particles B (UHP-G1H) | — | 38.3% by volume | 19.1% by volume | 19.1% by volume |
|  | Plate-like inorganic particles (HP-40) | 67.5% by volume | — | 33.8% by volume | 33.8% by volume |
|  | Alumina particles — Inorganic particles A (AS-50) | — | 24.9% by volume | 24.9% by volume | 24.9% by volume |
| Relative permittivity |  | 4 | 9 | 5.5 | 5.5 |
| Thickness ratio* |  | — | — | 1/1 | |
| Evaluation | Peel strength (N/cm) | C | A | C | |
|  | Thermal conductivity (W/(m · K)) | A | C | B | |
|  | BDV (kV) | A | C | A | |

*Thickness ratio: For a two-layer structure, second resin composition layer/first resin composition layer.

TABLE 3

| | | | Comparative Example 4 Structure of resin composition layer | | Comparative Example 5 Structure of resin composition layer | | Comparative Example 6 Structure of resin composition layer | |
|---|---|---|---|---|---|---|---|---|
| | | | Second resin composition layer | First resin composition layer | Second resin composition layer | First resin composition layer | Second resin composition layer | First resin composition layer |
| Composition of each resin composition layer | Epoxy resin | | 33.2% by volume | 29.3% by volume | 33.2% by volume | 29.3% by volume | 33.2% by volume | 29.3% by volume |
| | Dispersant | | 1.6% by volume | 1.2% by volume | 1.6% by volume | 1.2% by volume | 1.6% by volume | 1.2% by volume |
| | Curing agent | | 2.0% by volume | 2.0% by volume | 2.0% by volume | 2.0% by volume | 2.0% by volume | 2.0% by volume |
| | Agglomerated boron nitride particles | Inorganic particles B (UHP-G1H) | 38.3% by volume | — | 38.3% by volume | — | 38.3% by volume | — |
| | | Plate-like inorganic particles (HP-40) | — | 67.5% by volume | — | 67.5% by volume | — | 67.5% by volume |
| | Alumina particles | Inorganic particles A (AS-50) | 24.9% by volume | — | 24.9% by volume | — | 24.9% by volume | — |
| Relative permittivity | | | 9 | 4 | 9 | 4 | 9 | 4 |
| Thickness ratio* | | | 1/1 | | 3/1 | | 1/3 | |
| Evaluation | Peel strength (N/cm) | | C | | C | | C | |
| | Thermal conductivity (W/(m · K)) | | A | | B | | A | |
| | BDV (kV) | | A | | C | | A | |

| | | | Comparative Example 7 Structure of resin composition layer | | |
|---|---|---|---|---|---|
| | | | Third resin composition layer | Second resin composition layer | First resin composition layer |
| Composition of each resin composition layer | Epoxy resin | | 29.3% by volume | 33.2% by volume | 29.3% by volume |
| | Dispersant | | 1.2% by volume | 1.6% by volume | 1.2% by volume |
| | Curing agent | | 2.0% by volume | 2.0% by volume | 2.0% by volume |
| | Agglomerated boron nitride particles | Inorganic particles B (UHP-G1H) | 19.1% by volume | 38.3% by volume | — |
| | | Plate-like inorganic particles (HP-40) | 33.8% by volume | — | 67.5% by volume |
| | Alumina particles | Inorganic particles A (AS-50) | 24.9% by volume | 24.9% by volume | — |
| Relative permittivity | | | 5.5 | 9 | 4 |
| Thickness ratio* | | | 1/3/1 | | |
| Evaluation | Peel strength (N/cm) | | C | | |
| | Thermal conductivity (W/(m · K)) | | B | | |
| | BDV (kV) | | B | | |

*Thickness ratio: For a two-layer structure, second resin composition layer/first resin composition layer, and for a three-layer structure, third resin composition layer/second resin composition layer/first resin composition layer.

REFERENCE SIGNS LIST

10 laminated body
12 metal plate
14 resin composition layer
14X upper surface
14Y lower surface
16 metal base plate

The invention claimed is:

1. An electrical insulation sheet comprising a resin composition layer,
    wherein one surface side has a higher relative permittivity at a frequency of 1 MHz than a relative permittivity of an other surface side,
    wherein a circuit pattern is formed on the one surface side,
    wherein the resin composition layer is composed of at least two layers including a first resin composition layer and a second resin composition layer,
    wherein the resin composition layer comprises an inorganic filler,
    wherein the inorganic filler comprises plate-like inorganic particles, inorganic particles A, and inorganic particles B, wherein any one or more of the plate-like inorganic particles, the inorganic particles A, and the inorganic particles B have a thermal conductivity of 10 W/(m K) or more,
wherein the inorganic particles A are at least one of alumina and aluminum nitride,
wherein the inorganic particles B are boron nitride, and
wherein the plate-like inorganic particles are boron nitride having an average particle size of 20 μm or more,
wherein the first resin composition layer includes the one surface side and comprises the inorganic particles A and the inorganic particles B, and
wherein the second resin composition layer includes the other surface side and comprises the plate-like inorganic particles.

2. The electrical insulation sheet according to claim 1, wherein a relative permittivity at 10% in a thickness direction from the one surface is 3.5 to 9, and a relative permittivity at 10% in a thickness direction from the other surface is 3 to 8.5.

3. The electrical insulation sheet according to claim 1, wherein
the first resin composition layer comprising the one surface side has a relative permittivity at a frequency of 1 MHz that is higher than a relative permittivity of the second resin composition layer comprising the other surface side.

4. The electrical insulation sheet according to claim 3, further comprising a third resin composition layer on the other surface side of the second resin composition layer.

5. The electrical insulation sheet according to claim 4, wherein the third resin composition layer has a thickness that is smaller than a thickness of the second resin composition layer.

6. The electrical insulation sheet according to claim 4, wherein at least one of the first resin composition layer, the second resin composition layer, and the third resin composition layer comprises an epoxy resin and an inorganic filler.

7. The electrical insulation sheet according to claim 4, wherein
the third resin composition layer comprises the plate-like inorganic particles, the inorganic particles A and the inorganic particles B.

8. The electrical insulation sheet according to claim 4, wherein
the second resin composition layer further comprises the inorganic particles A and the inorganic particles B, and
the third resin composition layer comprises the plate-like inorganic particles.

9. The electrical insulation sheet according to claim 3, wherein the first resin composition layer has a thickness that is smaller than a thickness of the second resin composition layer.

10. The electrical insulation sheet according to claim 1, wherein the inorganic particles A have an aspect ratio of 2 or less.

11. The electrical insulation sheet according to claim 1, wherein the plate-like inorganic particles in the inorganic filler have a content of 1 to 90% by volume or less.

12. The electrical insulation sheet according to claim 1, wherein the plate-like inorganic particles are aggregated particles.

13. The electrical insulation sheet according to claim 1, wherein the inorganic particles B have a compressive strength when compressed by 20% that is higher than a compressive strength of the plate-like inorganic particles.

14. The electrical insulation sheet according to claim 1, wherein a difference between the relative permittivity on the one surface side and the relative permittivity on the other surface side is 0.5 or more.

15. A laminated body comprising the electrical insulation sheet according to claim 1 and a metal plate in that order on a metal base plate, wherein a circuit pattern is formed on the metal plate.

16. A substrate comprising the electrical insulation sheet according to claim 1 and a metal plate in that order on a metal base plate, wherein the metal plate has a circuit pattern.

17. The electrical insulation sheet according to claim 1, wherein the plate-like inorganic particles have a compressive strength when compressed by 20% of 0.8 N/mm$^2$ or more and 2.5 N/mm$^2$ or less.

* * * * *